(12) United States Patent
Lee et al.

(10) Patent No.: US 11,728,459 B2
(45) Date of Patent: Aug. 15, 2023

(54) DISPLAY MODULE, DISPLAY PANEL, AND DISPLAY APPARATUS

(71) Applicant: SAMSUNG ELECTRONICS CO., LTD., Suwon-si (KR)

(72) Inventors: Kwangjae Lee, Suwon-si (KR); Sungsoo Jung, Suwon-si (KR); Kyungbae Kim, Suwon-si (KR); Hyeongyeol Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 16/910,546

(22) Filed: Jun. 24, 2020

(65) Prior Publication Data
US 2021/0043801 A1    Feb. 11, 2021

(30) Foreign Application Priority Data

Aug. 8, 2019  (KR) .................. 10-2019-0096851

(51) Int. Cl.
| | |
|---|---|
| *H01L 33/08* | (2010.01) |
| *H01L 33/48* | (2010.01) |
| *H01L 33/52* | (2010.01) |
| *H01L 33/62* | (2010.01) |
| *H05K 1/18* | (2006.01) |
| *H05K 7/20* | (2006.01) |

(52) U.S. Cl.
CPC .......... *H01L 33/08* (2013.01); *H01L 33/483* (2013.01); *H01L 33/52* (2013.01); *H01L 33/62* (2013.01); *H05K 1/189* (2013.01); *H05K 7/20954* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 2004/0085491 A1 | 5/2004 | Ogawa et al. | |
| 2004/0114062 A1* | 6/2004 | Nishio | G06F 1/1601 349/58 |
| 2017/0013722 A1* | 1/2017 | Kim | H01L 24/27 |
| 2017/0159876 A1 | 6/2017 | Brashnyk et al. | |

(Continued)

FOREIGN PATENT DOCUMENTS

| | | |
|---|---|---|
| GB | 2531558 A | 4/2016 |
| KR | 10-2018-0011983 A | 2/2018 |
| KR | 10-2019-0061745 A | 6/2019 |

(Continued)

OTHER PUBLICATIONS

International Search Report (PCT/ISA/210) dated Oct. 26, 2020 by the International Searching Authority in counterpart International Patent Application No. PCT/KR2020/007014.

(Continued)

*Primary Examiner* — Anthony J Frost
(74) *Attorney, Agent, or Firm* — Sughrue Mion, PLLC

(57) ABSTRACT

A display panel includes a panel cover; and a plurality of display modules removably attached to the panel cover. Each of the plurality of display modules includes a substrate including a mounting surface on which a plurality of inorganic light emitting diodes is mounted, and a module plate attached to a surface opposite to the mounting surface of the substrate.

9 Claims, 10 Drawing Sheets

(56) References Cited

U.S. PATENT DOCUMENTS

2019/0179592 A1\* 6/2019 Hyeon .................. G09G 3/006

FOREIGN PATENT DOCUMENTS

| WO | 2017/182488 A2 | 10/2017 |
| WO | 2018/207273 A1 | 11/2018 |
| WO | 2019/094287 A1 | 5/2019 |

OTHER PUBLICATIONS

European Search Report dated Dec. 4, 2020 by the European Patent Office in counterpart European Patent Application No. 20180008.3.
Communication dated Mar. 2, 2022 by the European Patent Office in counterpart European Application No. 20180008.3.

\* cited by examiner

DISPLAY MODULE, DISPLAY PANEL, AND DISPLAY APPARATUS

CROSS-REFERENCE TO THE RELATED APPLICATION

This application is based on and claims priority under 35 U.S.C. § 119 to Korean Patent Application No. 10-2019-0096851, filed on Aug. 8, 2019, in the Korean Intellectual Property Office, the disclosure of which is herein incorporated by reference in its entirety.

BACKGROUND

1. Field

Embodiments of the disclosure relate to a display module, a display panel, and a display apparatus, and more particularly, to a display apparatus including a display panel including a plurality of display modules formed by mounting a plurality of inorganic light emitting diodes.

2. Description of Related Art

A display apparatus is a type of output device that visually displays data information, such as text or graphics, and images.

A liquid crystal panel or an organic light emitting diode (OLED) panel that is formed by depositing an OLED on a substrate has been used for a display apparatus. However, the liquid crystal panel has difficulties such as a slow reaction time, and large power consumption. Further, the liquid crystal panel has difficulties in the compact design because it does not emit light itself and thus requires a backlight. In addition, OLED panels have a short service life and poor production yield rates. Accordingly, as a new panel to replace the panels, a micro light emitting diode (micro LED or μLED) display panel that mounts an inorganic light emitting diode on a substrate and uses the inorganic light emitting diode itself as a pixel has been studied.

The micro LED display panel is one of the flat panel display panels and composed of a plurality of inorganic light emitting diodes (inorganic LEDs) of 100 micrometers or less. In comparison with liquid crystal display (LCD) panels that require a backlight, the micro LED display panel provides better contrast, response time, and energy efficiency. Both organic light emitting diodes (OLEDs) and micro LEDs corresponding to inorganic light emitting diodes have good energy efficiency, but the micro LEDs have better brightness and luminous efficiency and a longer service life than the OLEDs.

Because the micro LED display panel does not need a backlight and may have a minimized bezel, it is possible to implement compact and thin designs and to have excellent brightness, resolution, power consumption, and durability.

In addition, because there is no complicated process other than the process of picking up inorganic light emitting diodes from a wafer and transferring it to a substrate, the micro LED display panel may be manufactured in various resolutions and sizes according to the customer's order and it is easy to implement a big screen by assembling unit panel modules.

SUMMARY

Therefore, it is an aspect of the disclosure to provide a bezel-less display apparatus.

It is another aspect of the disclosure to provide a display panel and a display apparatus capable of minimizing a step and/or gap among a plurality of display modules.

It is another aspect of the disclosure to provide a display panel and a display apparatus capable of easily replacing one display module among a plurality of display modules.

Additional aspects of the disclosure will be set forth in part in the description which follows and, in part, will be understood from the description, or may be learned by practice of the disclosure.

According to one or more embodiment, a display panel is provided. The display panel includes a panel cover; and a plurality of display modules removably attached to the panel cover, a display module of the plurality of display modules including: a substrate including a mounting surface on which a plurality of inorganic light emitting diodes is mounted, and a module plate attached to a surface opposite to the mounting surface of the substrate.

According to an embodiment, a boss mounting portion is formed in the display module of the plurality of display modules by the module plate of the display module mounted on the substrate of the display module.

According to an embodiment, a thickness of a first part of the display module, in which the boss mounting portion is formed, is less than a thickness of a second part of the display module in which the module plate is arranged.

According to an embodiment, the panel cover includes an optical film.

According to an embodiment, an adhesive layer is provided between the panel cover and the plurality of display modules.

According to an embodiment, the panel cover includes glass.

According to an embodiment, the module plate includes aluminum.

According to one or more embodiments, a display apparatus is provided. The display apparatus includes a display panel including a panel cover and a plurality of display modules removably attached to the panel cover, each of the plurality of display modules including a substrate on which a plurality of inorganic light emitting diodes is mounted; a frame configured to support the display panel; at least one boss mounted on at least one of the plurality of display modules, respectively; and a fastening member coupled to the frame and one of the at least one boss such as to fix the display panel to the frame.

According to an embodiment, the display apparatus further includes a double-sided tape extending along an edge of the display panel between the display panel and the frame.

According to an embodiment, the display apparatus further includes a panel board arranged between the display panel and the frame, and electrically connected to the plurality of display modules, wherein the panel board is accommodated within the frame.

According to an embodiment, the display apparatus further includes a rear cover configured to cover a rear of the frame; and a device board arranged between the frame and the rear cover, and electrically connected to the panel board.

According to an embodiment, another display module of the plurality of display modules includes a substrate on which another plurality of inorganic light emitting diodes is mounted, wherein each of the display module and the another display module of the plurality of display modules includes a flexible printed circuit board (FPCB) electrically connected to the substrate of the respective display module, and wherein the panel board is electrically connected to the FPCB of the display module and the FPCB of the another display module.

According to an embodiment, the frame includes: a frame body configured to cover a rear of the display panel; and an edge cover configured to cover an edge of the display panel.

According to an embodiment, each of the plurality of display modules includes a boss mounting portion on which a respective one of the at least one boss is mounted.

According to an embodiment, another display module of the plurality of display modules includes a substrate on which another plurality of inorganic light emitting diodes is mounted, and wherein each of the display module and the another display module of the plurality of display modules includes a module plate configured to reinforce strength of the substrate of the respective display module.

According to one or more embodiments, a display module is provided. The display module includes a substrate; a plurality of inorganic light emitting diodes mounted on a mounting surface of the substrate; and a module plate attached to a surface opposite to the mounting surface of the substrate, wherein a boss mounting portion on the substrate is formed by the module plate mounted on the substrate of the display module.

According to an embodiment, the boss mounting portion is positioned on at least one corner of the substrate.

According to an embodiment, the display module further includes a module Printed Circuit Board (PCB) electrically connected to the surface opposite to the mounting surface of the substrate, wherein the module plate is arranged between the substrate and the module PCB.

According to an embodiment, the module plate includes a thermal conductive material.

According to an embodiment, the module plate includes an edge that exposes the boss mounting portion.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
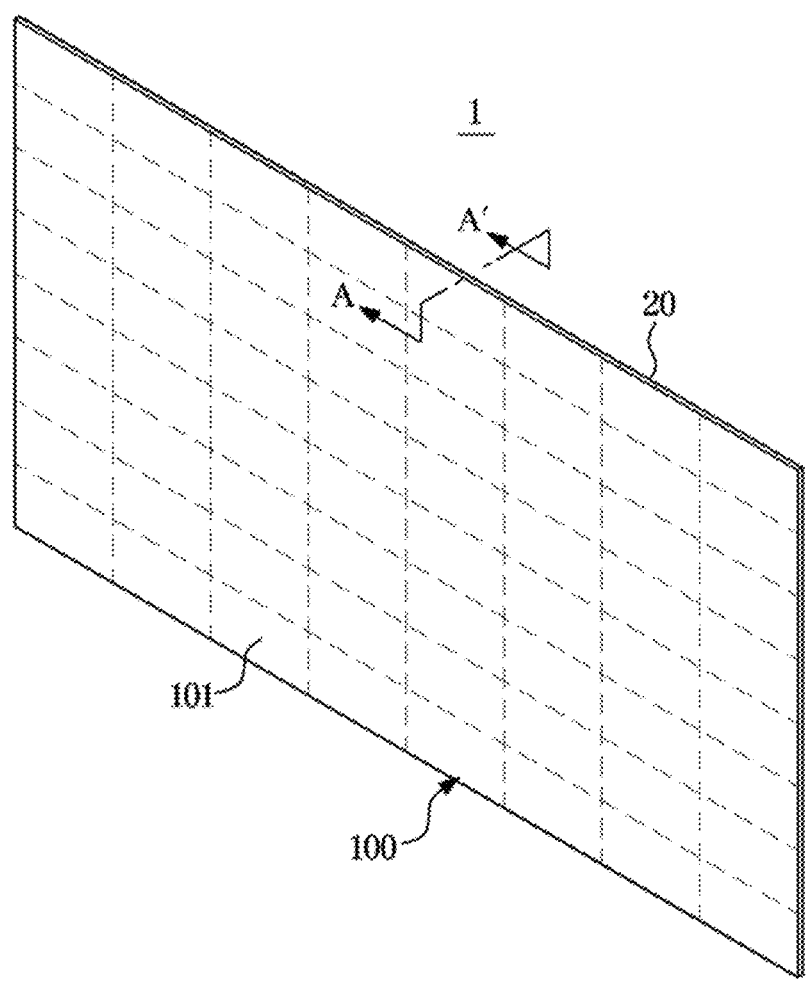
FIG. 1 is a view illustrating an exterior of a display apparatus according to an embodiment of the disclosure.

Embodiments described in the disclosure and configurations shown in the drawings are merely examples of embodiments of the disclosure, and may be modified in various different ways at the time of filing of the present application to replace the described embodiments and drawings of the disclosure.

The singular forms "a," "an" and "the" are intended to include the plural forms as well, unless the context clearly indicates otherwise. For a clear description, the shape and size of the elements may be emphasized in the drawings.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

In addition, a plate in the disclosure includes a thin film or sheet, comprehensively.

Embodiments of the disclosure will be described more fully hereinafter with reference to the accompanying drawings.

Figure 2:
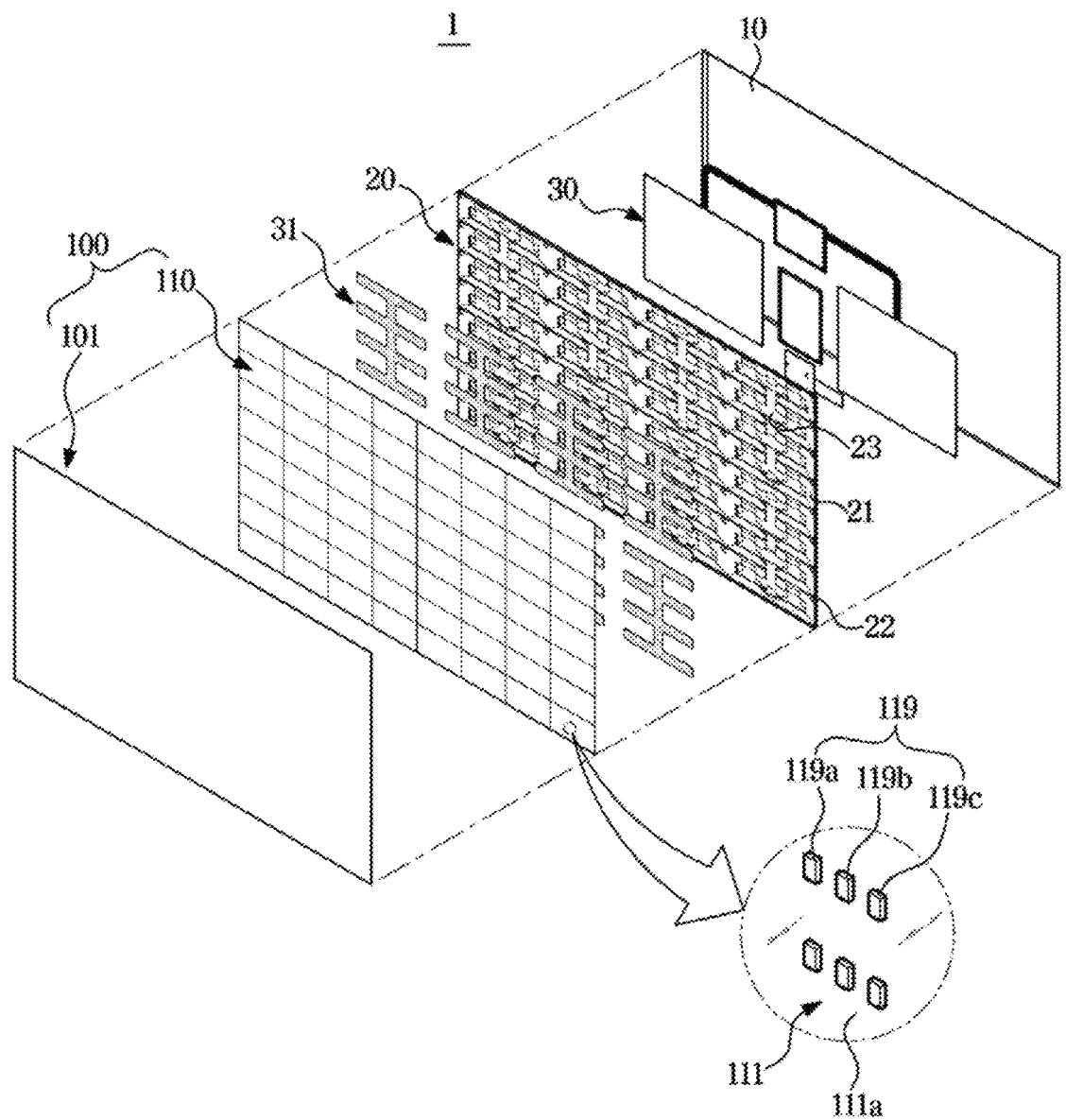
FIG. 2 is an exploded view of main components of the display apparatus illustrated in FIG. 1.
Figure 3:
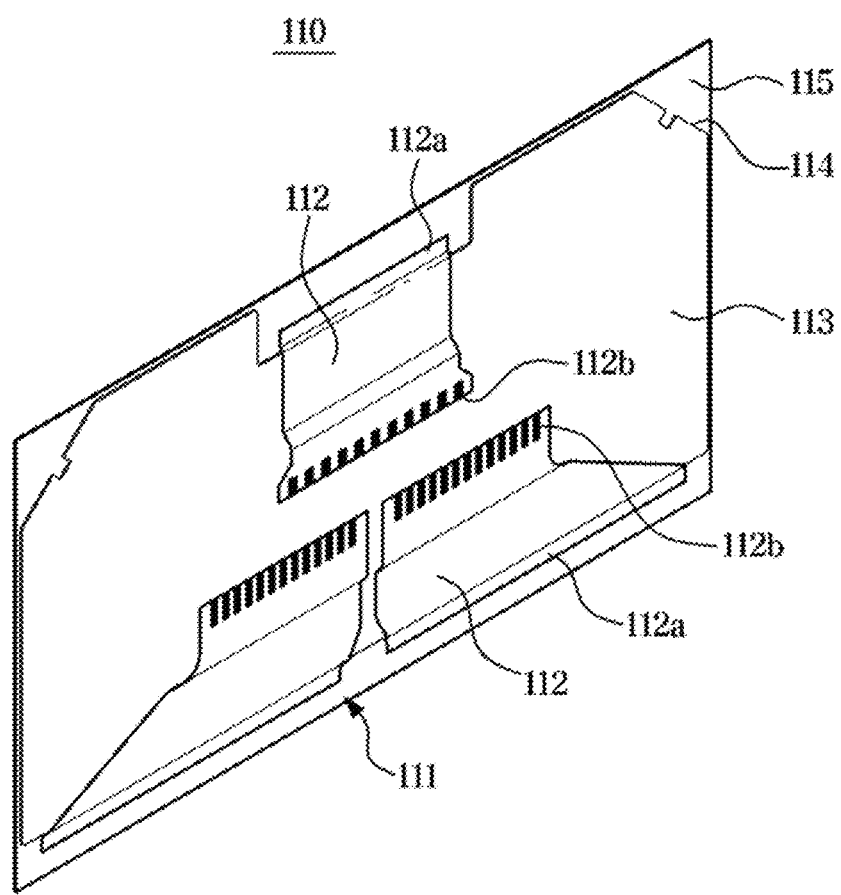
FIG. 3 is a view illustrating a rear surface of one display module among the plurality of display modules illustrated in FIG. 2.
Figure 4:
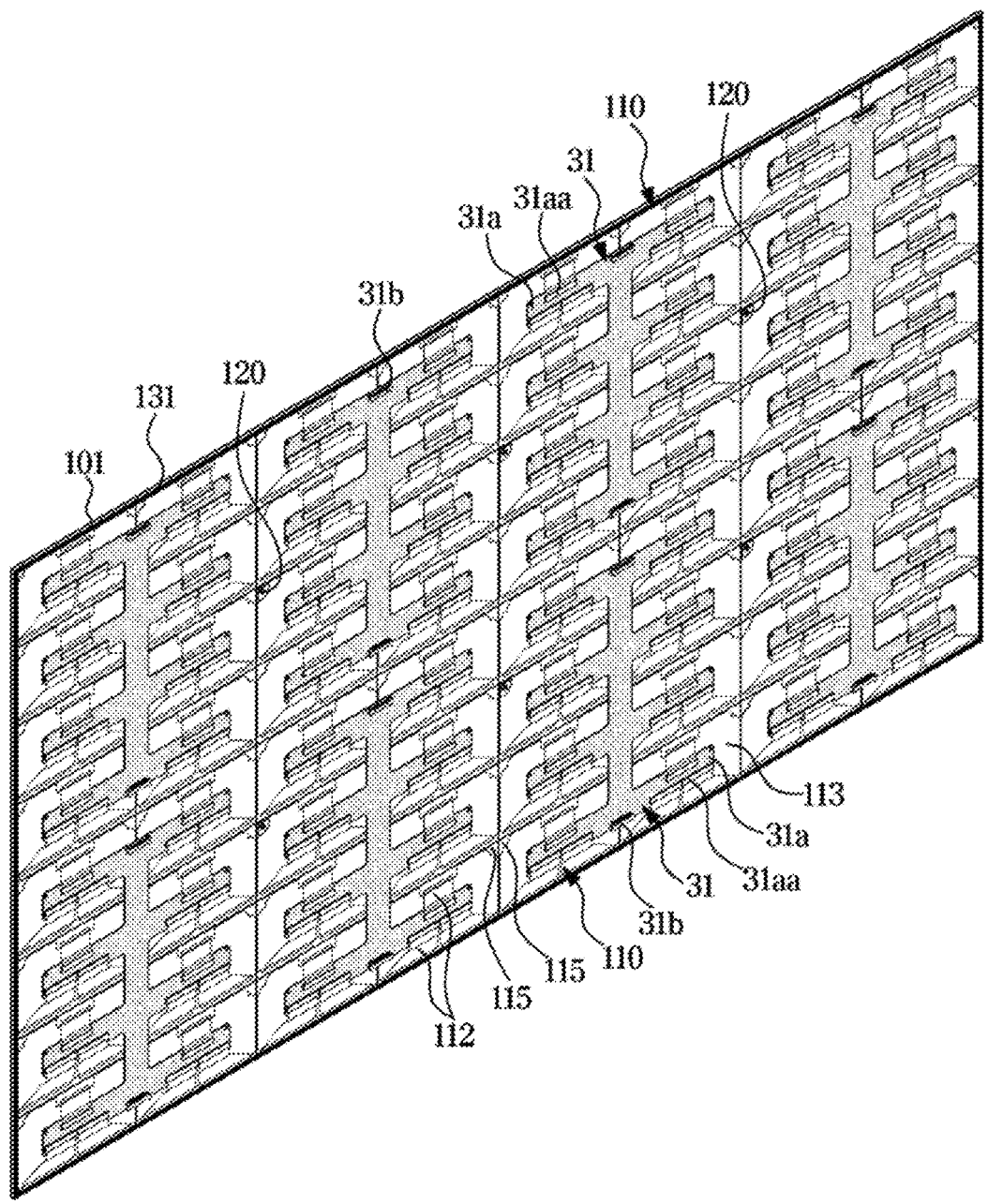
FIG. 4 is a view illustrating a state in which a panel board is mounted on the display panel illustrated in FIG. 2.
Figure 5:
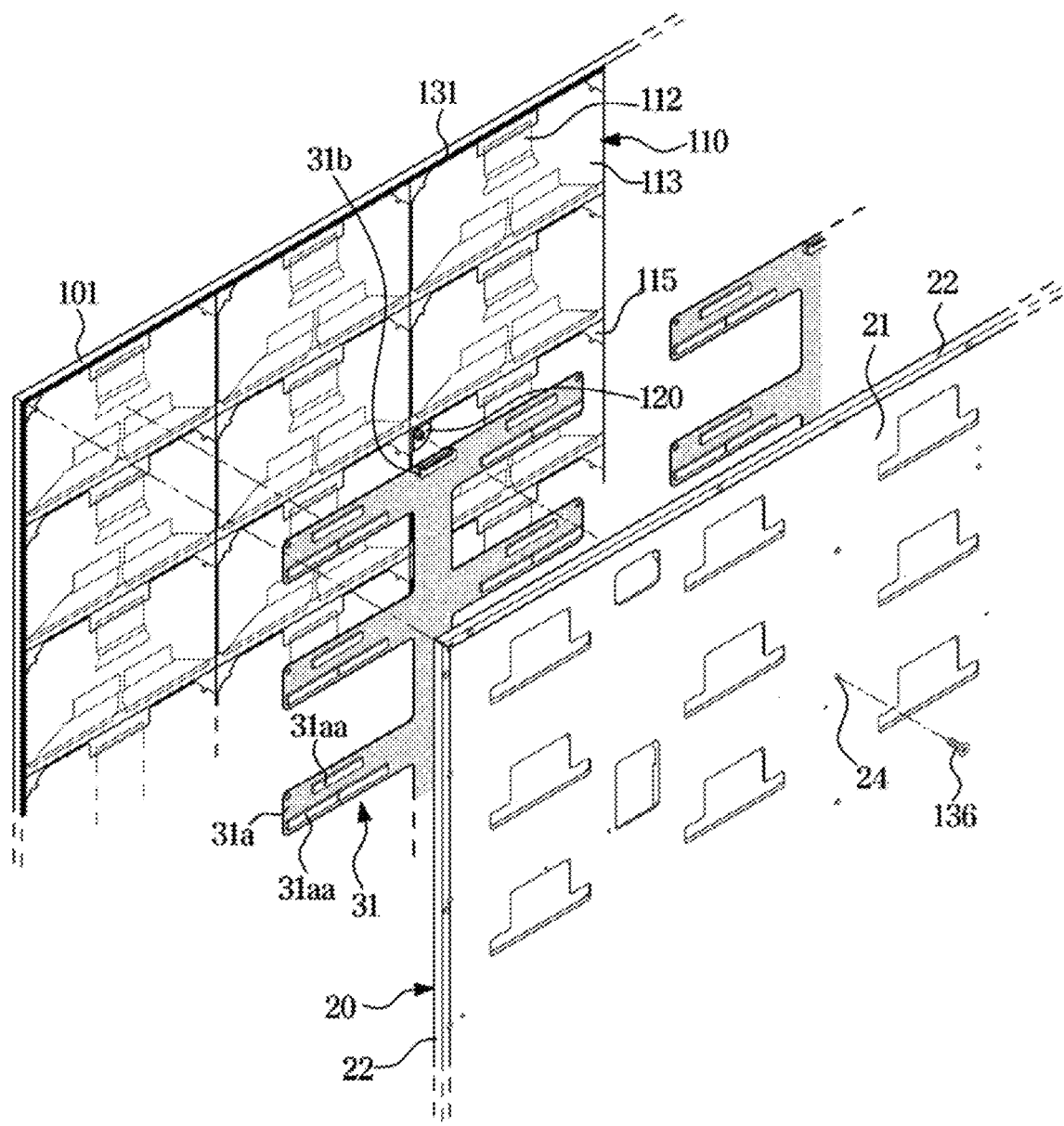
FIG. 5 is a view illustrating a state in which the panel board and a frame are mounted on the display panel illustrated in FIG. 2.
Figure 6:
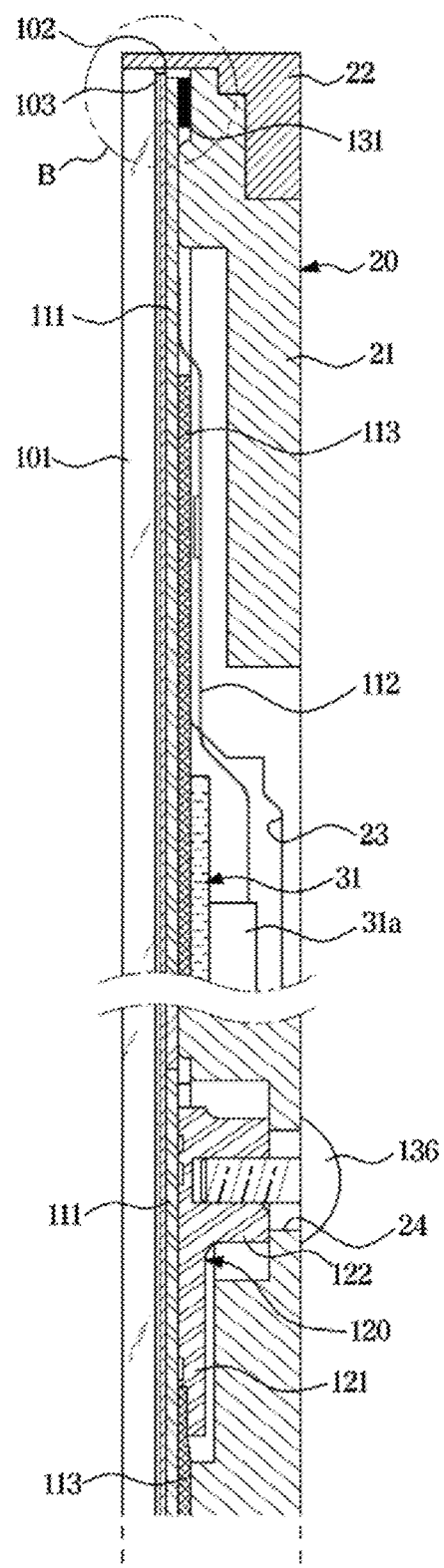
FIG. 6 is a view illustrating a part of a cross section along line A-A' of FIG. 1.
Figure 7:
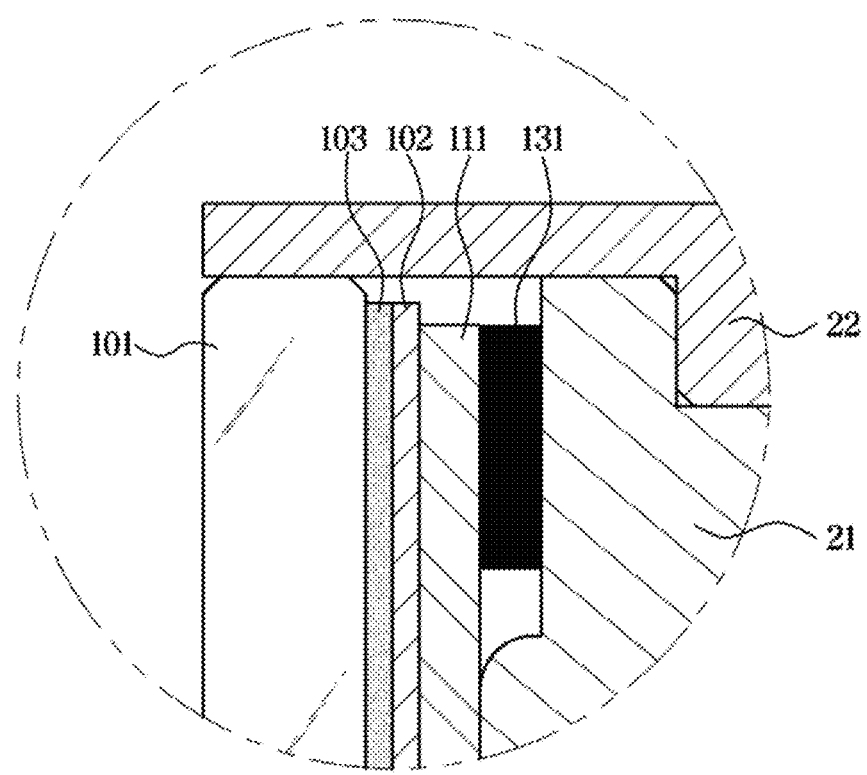
FIG. 7 is an enlarged view illustrating a part B of FIG. 6.

FIG. 1 is a view illustrating an exterior of a display apparatus according to an embodiment of the disclosure. FIG. 2 is an exploded view of main components of the display apparatus illustrated in FIG. 1. FIG. 3 is a view illustrating a rear surface of one display module among the plurality of display modules illustrated in FIG. 2. FIG. 4 is a view illustrating a state in which a panel board is mounted on the display panel illustrated in FIG. 2. FIG. 5 is a view illustrating a state in which the panel board and a frame are mounted on the display panel illustrated in FIG. 2. FIG. 6 is a view illustrating a part of a cross section along line A-A' of FIG. 1. FIG. 7 is an enlarged view illustrating a part B of FIG. 6.

Referring to FIGS. 1 and 2, a display apparatus 1 is a device configured to display information, materials, data and the like with characters, figures, graphs, images, etc., and TV, personal computer (PC), mobile, and digital signage may be implemented with the display apparatus 1. The display apparatus 1 may be installed on the ground by a stand (not shown) or may be installed on the wall.

According to an embodiment of the disclosure, the display apparatus 1 may include a display panel 100 on which an image is displayed, a frame 20 configured to support the display panel 100, and a rear cover 10 configured to accommodate the display panel 100 and the frame 20. The display panel 100 installed on the frame 20 may implement a screen of the display apparatus 1.

The rear cover 10 may form a part of the exterior of the display apparatus 1. The rear cover 10 may form a rear exterior of the display apparatus 1. The rear cover 10 may be arranged to cover the rear of the frame 20.

The rear cover 10 and the frame 20 may be formed of a metal or resin material to have rigidity, or a heat conductive material to rapidly diffuse and cool heat generated from the display panel 100.

The frame 20 may have an approximately rectangular shape. The frame 20 may include a frame body 21 configured to cover the rear of the display panel 100 and an edge cover 22 arranged on an edge portion of the frame body 21. The edge cover 22 may extend toward the front of the display apparatus 1. The edge cover 22 may form an exterior of an upper surface, an exterior of a lower surface, and an exterior of a side surface of the display apparatus 1.

The display panel 100 may be accommodated and supported by the frame 20. Details of coupling between the frame 20 and the display panel 100 will be described later.

The display apparatus 1 may include a device board 30 arranged between the frame 20 and the rear cover 10. The device board 30 may include a switching mode power supply configured to supply power required for driving the display apparatus 1. The device board 30 may include a printed circuit board (PCB) configured to control an image displayed on the display panel 100. The device board 30 may include a timing controller configured to adjust the amount of data transmitted to one or more panel boards 31 and configured to improve image quality. The device board 30 may include a signal processing board for data processing.

The display apparatus 1 may include the panel boards 31 arranged between the frame 20 and the display panel 100. The panel boards 31 may be configured to control a plurality of display modules 110. The panel boards 31 may be electrically connected to each of the plurality of display modules 110. It is illustrated that eight panel boards 31 are provided, and the panel boards 31 are electrically connected to eight of the display modules 110, respectively, in this embodiment, but the electrical connection between the panel boards 31 and the plurality of display modules 110 is not limited thereto. The panel boards 31 may be electrically connected to the device board 30. The panel boards 31 may receive power or data from the device board 30.

The frame 20 may include a board receiving portion 23 for accommodating the panel boards 31. The board receiving portion 23 may be provided in a size and/or shape corresponding to the panel boards 31. The board receiving portion 23 may be recessed from the front surface of the frame body 21. Because the panel boards 31 are accommodated in the board receiving portion 23, it is possible to reduce the thickness of the display apparatus 1.

The display panel 100 may include the plurality of display modules 110 and a panel cover 101 arranged in front of the plurality of display modules 110. The display panel 100 may be implemented as a large screen by tiling the plurality of display modules 110 on the panel cover 101.

The plurality of display modules 110 may be arranged in an M*N matrix to be vertically and horizontally adjacent to each other. In the embodiment, 64 display modules 110 are installed in the frame 20 in an 8*8 matrix, but the number or arrangement of the plurality of display modules 110 is not limited thereto. Therefore, the number or arrangement of the plurality of display modules 110 may vary. The plurality of display modules 110 may have a flat shape or a curved shape and a curvature thereof may be variable.

The plurality of display modules 110 may have the same configuration. Therefore, the description of any one of the display modules 110 described below may be applied to all other display modules 110 in the same way.

Each of the display modules 110 may include a substrate 111 and a plurality of inorganic light emitting elements mounted on a front surface of the substrate 111. The surface, on which the plurality of inorganic light emitting elements is mounted, may be referred to as a mounting surface 111a.

The substrate 111 may be formed by including materials such as polyimide (PI), FR4, and glass. A driver layer (not shown) including a pixel electrode (not shown) and a Thin Film Transistor (TFT) may be formed on the mounting surface 111a of the substrate 111 on which the plurality of inorganic light emitting elements is mounted. The substrate 111 may include a glass substrate. The substrate 111 may include a Chip on Glass (COG) type substrate.

The inorganic light emitting element may include an inorganic Light Emitting Diodes (LEDs) 119a, 119b, and 119c. The inorganic LEDs 119a, 119b, and 119c may be formed of inorganic material such as silicon (Si), sapphire, or gallium nitride (GaN). In comparison with an organic light emitting diode (OLED) formed of an organic material, the inorganic LEDs 119a, 119b, and 119c may be strong in oxygen and moisture and have a long service life and excellent power efficiency.

The inorganic LEDs 119a, 119b, and 119c may be picked up from the source wafer and directly mounted on the substrate 111. The inorganic LEDs 119a, 119b, and 119c may be picked up and transferred through an electrostatic method using an electrostatic head or an adhesive method using elastic polymer materials such as polydimethylsiloxane (PDMS) or silicone as a head. A horizontal length, vertical length, and height of the inorganic LEDs 119a, 119b, and 119c may be several micrometers (μm) to several hundred micrometers (μm), respectively.

The inorganic LEDs 119a, 119b, and 119c may include a p-n diode, a first contact electrode, and a second contact electrode. The inorganic LEDs 119a, 119b, and 119c may be a flip chip type in which the first contact electrode and the second contact electrode are arranged in the same direction. The first contact electrode and the second contact electrode of the inorganic LEDs 119a, 119b, and 119c may be connected to an electrode of the substrate 111 through soldering. Alternatively, the inorganic LEDs 119a, 119b, and 119c may be connected to an electrode of the substrate 111 through an anisotropic conductive film including fine conductive particles. In addition, the inorganic LEDs 119a, 119b, and 119c may be a lateral or vertical type, or may be connected to an electrode of the substrate through a wire.

The inorganic LED 119a may be a red inorganic LED configured to generate red light, the inorganic LED 119b may be a green inorganic LED configured to generate green light, and the inorganic LED 119c may be a blue inorganic LED configured to generate blue light.

The inorganic LED 119a, the inorganic LED 119b, and the inorganic LED 119c may form a single LED group from among LED groups 119. The single LED group from among the LED groups 119 may form a single pixel. That is, the inorganic LED 119a, the inorganic LED 119b, and the inorganic LED 119c form a red sub-pixel, a green sub-pixel, and a blue sub-pixel, respectively, and the red sub-pixel, the green sub-pixel, and the blue sub-pixel may form a single pixel.

In FIG. 2, it is illustrated that the inorganic LED 119a, the inorganic LED 119b, and the inorganic LED 119c are arranged in a line, but an arrangement of the inorganic LEDs 119a, 119b, and 119c is not limited thereto. Therefore, the inorganic LED 119a, the inorganic LED 119b, and the inorganic LED 119c may be arranged in a triangular shape, or other various shapes.

A distance between the LED groups 119 may be constant. The distance between the LED groups 119 may be variously selected according to the resolution and size of the display apparatus 1.

A black layer (not shown) may be formed on the substrate 111 to absorb light between the inorganic LEDs 119a, 119b, and 119c. An encapsulation layer (not shown) may be formed on the substrate 111 to protect the inorganic LEDs 119a, 119b, and 119c. The encapsulation layer may be formed on the substrate 111 to cover the inorganic LEDs 119a, 119b, and 119c. The encapsulation layer may be formed of a resin such as epoxy or silicone, or Optically Clear Adhesive (OCA), or Optically Clear Resin (OCR). In order to physically protect the inorganic LEDs 119a, 119b, and 119c sufficiently, and at the same time, to improve image quality, the encapsulation layer may include a viscoelastic material in which viscoelasticity and curing degree change according to changes in temperature or pressure. The viscoelastic material may include at least one of ethylene-based, acetate-based, ethylene-vinyl acetate-based, olefin-based, and acrylic-based compounds.

The panel cover 101 configured to protect and support the plurality of display modules 110 may be attached to the front surface of the plurality of display modules 110. The panel cover 101 may be formed by including glass. The plurality of display modules 110 may be removably attached to the panel cover 101. An adhesive layer 102 formed of a transparent material (refer to FIG. 7) may be arranged between the plurality of display modules 110 and the panel cover 101. The adhesive layer 102 may be provided to easily separate the plurality of display modules 110 from the panel cover 101.

The panel cover 101 may include an optical film 103 (refer to FIG. 7) configured to improve optical performance. A circularly polarized film, a linearly polarized film, a phase difference film, an AG/LR/AR/HC film, a Neutral Density (ND) film, which are used to improve image quality, are used alone as the optical film 103 or alternatively, two or more films thereof may be laminated and then used as the optical film 103.

Referring to FIG. 3, one of the display modules 110 may include a module plate 113 arranged on a surface opposite to the mounting surface 111a of the substrate 111. The module plate 113 may be manufactured in a thin film or sheet form, and then attached to the substrate 111 through an adhesive or heat dissipation tape. Between the substrate 111 and a module printed circuit board (PCB) 112 (hereinafter referred to as module PCB), the module plate 113 may be arranged in a direction opposite to a direction in which the inorganic LEDs emit light.

The module plate 113 may be formed by including a material having thermal conductivity for heat dissipation of a corresponding one of the display modules 110. Further, the module plate 113 may be formed by including a material having a predetermined stiffness or more to reinforce the strength of a respective one of the display modules 110 so as to prevent damage. The module plate 113 may be provided to prevent light leakage caused by the substrate 111 formed of a semi-transparent material. The visibility of the display apparatus 1 may be improved by the module plate 113. The module plate 113 may be formed by including aluminum (Al).

The module plate 113 may form a boss mounting portion 115 on the substrate 111 when the module plate 113 is attached to the substrate 111.

The module plate 113 may be formed to be thinner than the substrate 111. In order to form the boss mounting portion 115, the module plate 113 may include an edge portion 114 formed on the upper left and right sides of the module plate 113. The edge portion 114 may be formed at a corner portion of the module plate 113. When the module plate 113 is mounted on the substrate 111, the boss mounting portion 115 may be exposed to face the frame 20 by the edge portion 114.

A boss 120 (refer to FIG. 4) may be removably mounted to the boss mounting portion 115. The boss mounting portion 115 may be positioned on the rear surface of the substrate 111. The boss mounting portion 115 may be positioned on at least one corner of the substrate 111. The boss mounting portion 115 may be formed to correspond to the shape and/or size of a fixer 121 (see FIG. 6) of the boss 120.

The boss 120 may be attached to one of the plurality of display modules 110 by the boss mounting portion 115. When the display panel 100 is fixed to the frame 20 or when one display module is separated from other display modules of the plurality of display modules 110, the boss 120 may be attached to the one display module of the plurality of display modules 110 corresponding to a separation target.

Each of the display modules 110 may include a respective module PCB 112. One end 112a of the module PCB 112 may be electrically connected to a surface opposite to the mounting surface 111a of the substrate 111. An other end 112b of the module PCB 112 may be electrically connected to one of the panel boards 31. The module PCB 112 may be provided as a flexible printed circuit board (FPCB). Through each module PCB 112, each of the display modules 110 may respectively receive power and data for driving. The module PCB 112 may be provided in plural.

Referring to FIGS. 4 and 5, each of the panel boards 31 may include one or more of the connector 31a. It is illustrated that eight of the panel boards 31 are provided and each of the panel boards 31 include eight of the connector 31a in this embodiment, but the number of the panel boards 31 and the number of the connector 31a of the panel boards 31 are not limited thereto.

Each connector 31a may be electrically connected to a respective one of the display modules 110. For example, eight of the display modules 110 may be electrically connected to one of the panel boards 31 via the eight of the connector 31a of the one of the panel boards 31, respectively. Each connector 31a may be electrically connected to the module PCB 112 of a respective one of the display modules 110.

A connection terminal 31aa may be provided in each connector 31a. The connection terminal 31aa may be electrically connected to the other end 112b of the module PCB 112. Due to this configuration, the panel boards 31 may supply power or transmit data to the display modules 110.

The panel boards 31 each may include a board connector 31b. A wire (not shown) or a PCB (not shown) extending from the device board 30 may be electrically connected to the board connector 31b. Each of the panel boards 31 may be electrically connected to the device board 30 by the respective board connector 31b. The panel boards 31 may receive power or data from the device board 30 by the respective board connector 31b.

The boss 120 may be mounted on at least one of the plurality of display modules 110. The boss 120 may be configured to be screwed to a fastening member 136 (see FIG. 6). The boss 120 may include the fixer 121 fixed to one of the display modules 110 and a coupler 122 protruding from the fixer 121 and then coupled to the fastening member 136. The coupler 122 may include a thread formed to be screwed to the fastening member 136. In this embodiment, six of the boss 120 are provided, but the number of the boss 120 is not limited thereto. The fastening member 136 (e.g. a fastener) may include screws and bolts.

Referring to FIGS. 5 and 6, the boss 120 may be coupled to the fastening member 136 when the display panel 100 is mounted to the frame 20. Particularly, for coupling the display panel 100 to the frame 20, the boss 120 may be mounted on the display panel 100, and a frame hole 24 may be formed on the frame 20. When the display panel 100 is coupled to the frame 20, the frame hole 24 of the frame 20 may be positioned to correspond to the boss 120 of the display panel 100, and at this time, the fastening member 136 may be coupled to the frame hole 24 of the frame 20 and the boss 120.

The display panel 100 may be fixed to the frame 20 by an adhesive member 131 and the fastening member 136. The adhesive member 131 may fix the edge portion of the display panel 100 to the frame 20, and the fastening member 136 may fix a part of an inside of the display panel 100 to the frame 20.

Particularly, the boss 120 may be positioned in the inside of the rear surface of the display panel 100. The boss 120 may be mounted at any position inside the rear surface of the display panel 100. A coupling force between the boss 120 and the fastening member 136 may be applied to a part of the inside of the display panel 100 and the frame 20.

The adhesive member 131 may be provided to fix the edge portion of the display panel 100 and the frame 20 to each other. Together with the boss 120 and the fastening member 136, the adhesive member 131 may provide a fixing force for fixing the display panel 100 to the frame 20. The adhesive member 131 may extend along a rear edge of the display panel 100. The adhesive member 131 may be arranged along an edge between the display panel 100 and the frame 20. The adhesive member 131 may fix the edge portion of the display panel 100 to the edge portion of the frame 20.

An insulating double-sided tape may be used as the adhesive member 131. Alternatively, an ultraviolet curing resin that is cured by ultraviolet rays may be used as the adhesive member 131. However, the adhesive member 131 is not limited thereto and thus any material having appropriate adhesive strength such as a thermosetting resin cured by heat may be used as the adhesive member 131.

The display panel 100 may be mounted and fixed to the frame 20 by the adhesive member 131 and the fastening member 136. Therefore, when the display panel 100 is mounted to the frame 20, the frame body 21 may cover the rear of the display panel 100 and the edge cover 22 may cover the edge of the display panel 100. Because the display apparatus 1 includes the display panel 100 in which the plurality of display modules 110 is mounted on the panel cover 101, a front chassis configured to support the plurality of display modules 110 may be omitted, which is different from the conventional method. That is, because the frame 20 supports the panel cover 101 configured to support the plurality of display modules 110, the bezel may be minimized in the display apparatus 1 according to an embodiment of the disclosure. That is, the display apparatus 1 according to an embodiment of the disclosure may be implemented as a bezel-less display apparatus.

In addition, the boss mounting portion 115, on which the boss 120 is mounted, may be formed on one or more of the display modules 110 and a thickness of a part of the one or more of the display modules 110, in which the boss mounting portion 115 is formed, may be less than a thickness of other parts. Therefore, although the boss 120 configured to mount the display panel 100 to the frame 20 is mounted on the one or more of the display modules 110, the thickness of the display apparatus 1 may become relatively small.

Figure 8:
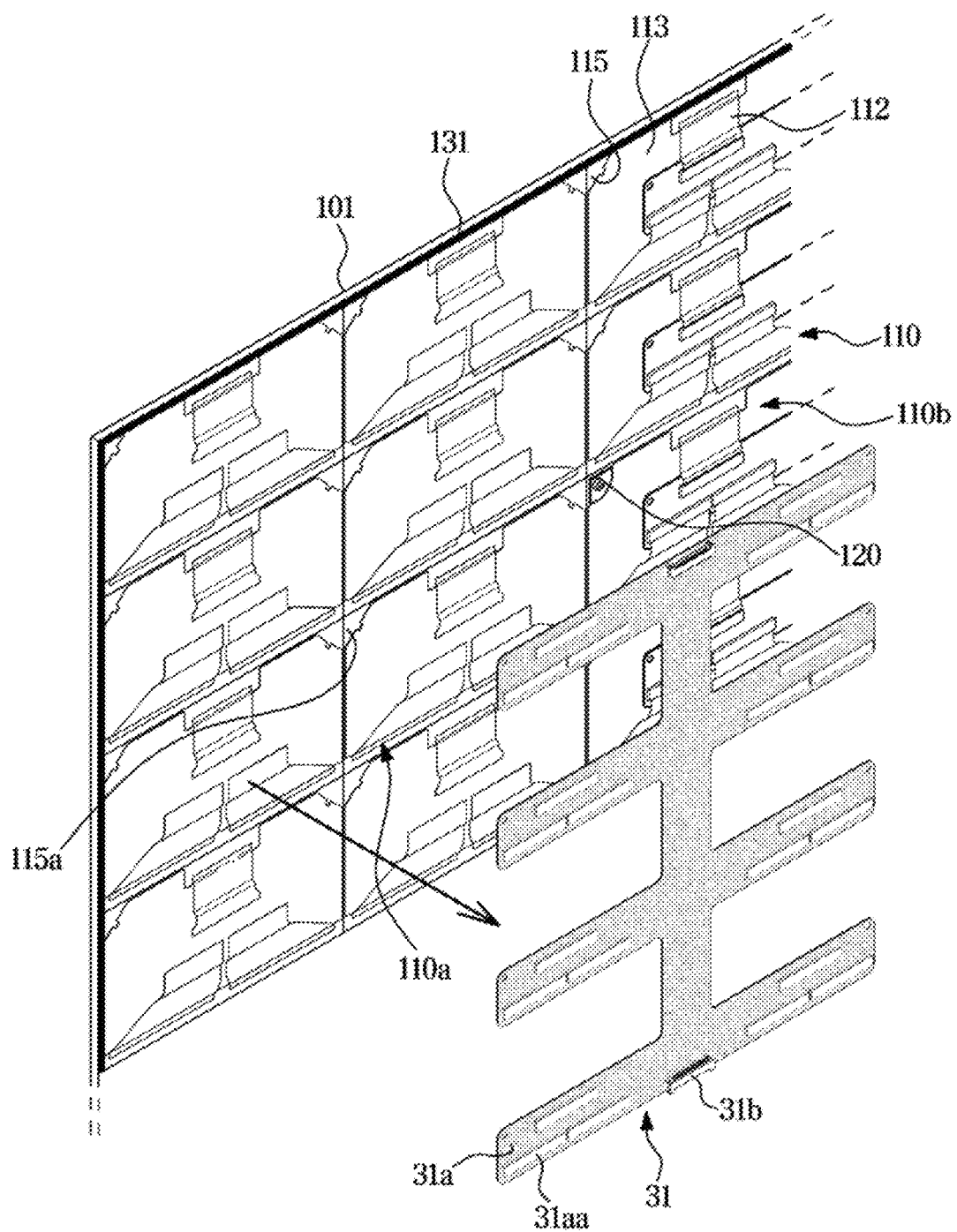
FIG. 8 is a first view for sequentially illustrating a process for replacing one display module among the plurality of display modules of FIG. 2.
Figure 9:
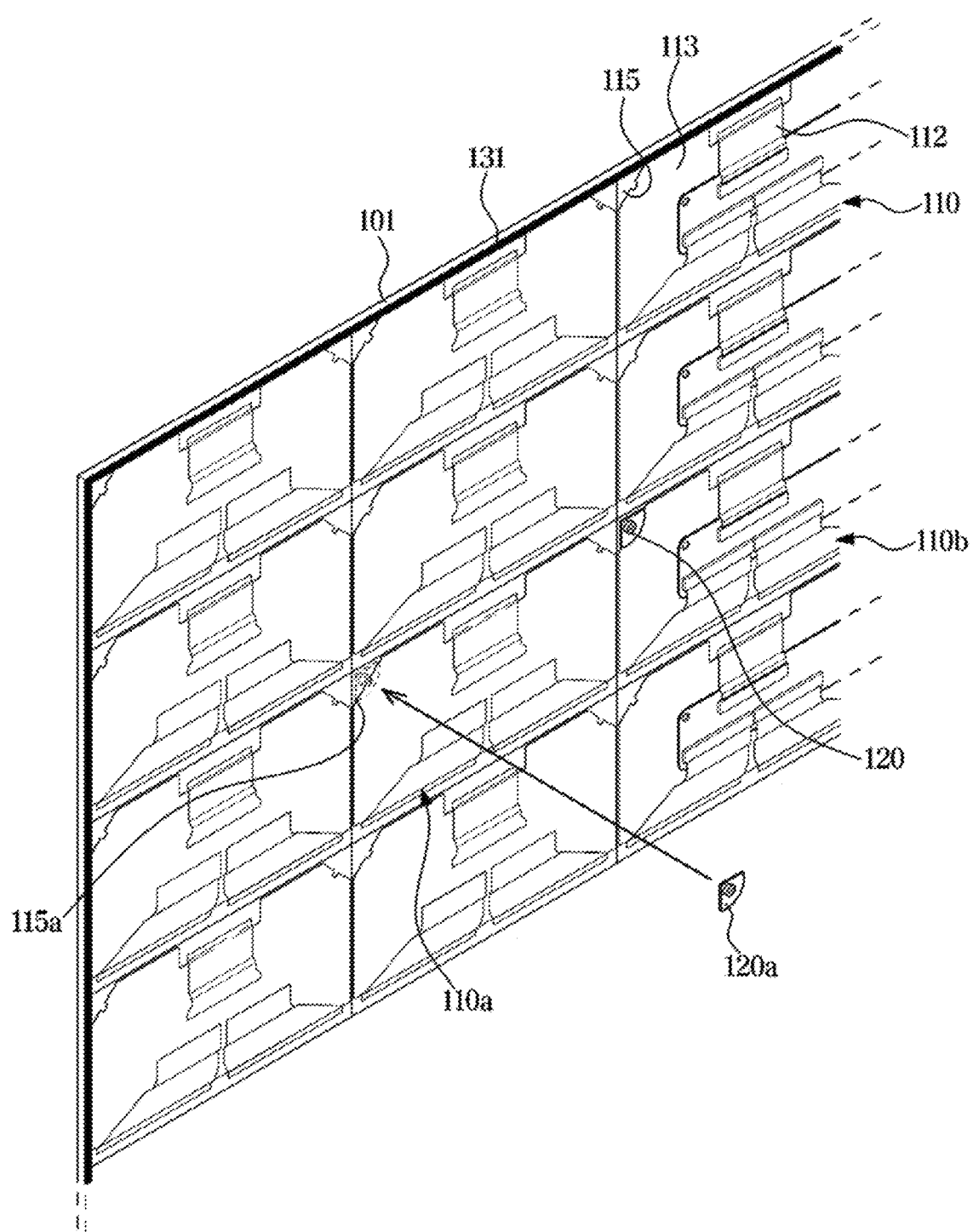
FIG. 9 is a second view for sequentially illustrating the process for replacing the one display module among the plurality of display modules of FIG. 2.
Figure 10:
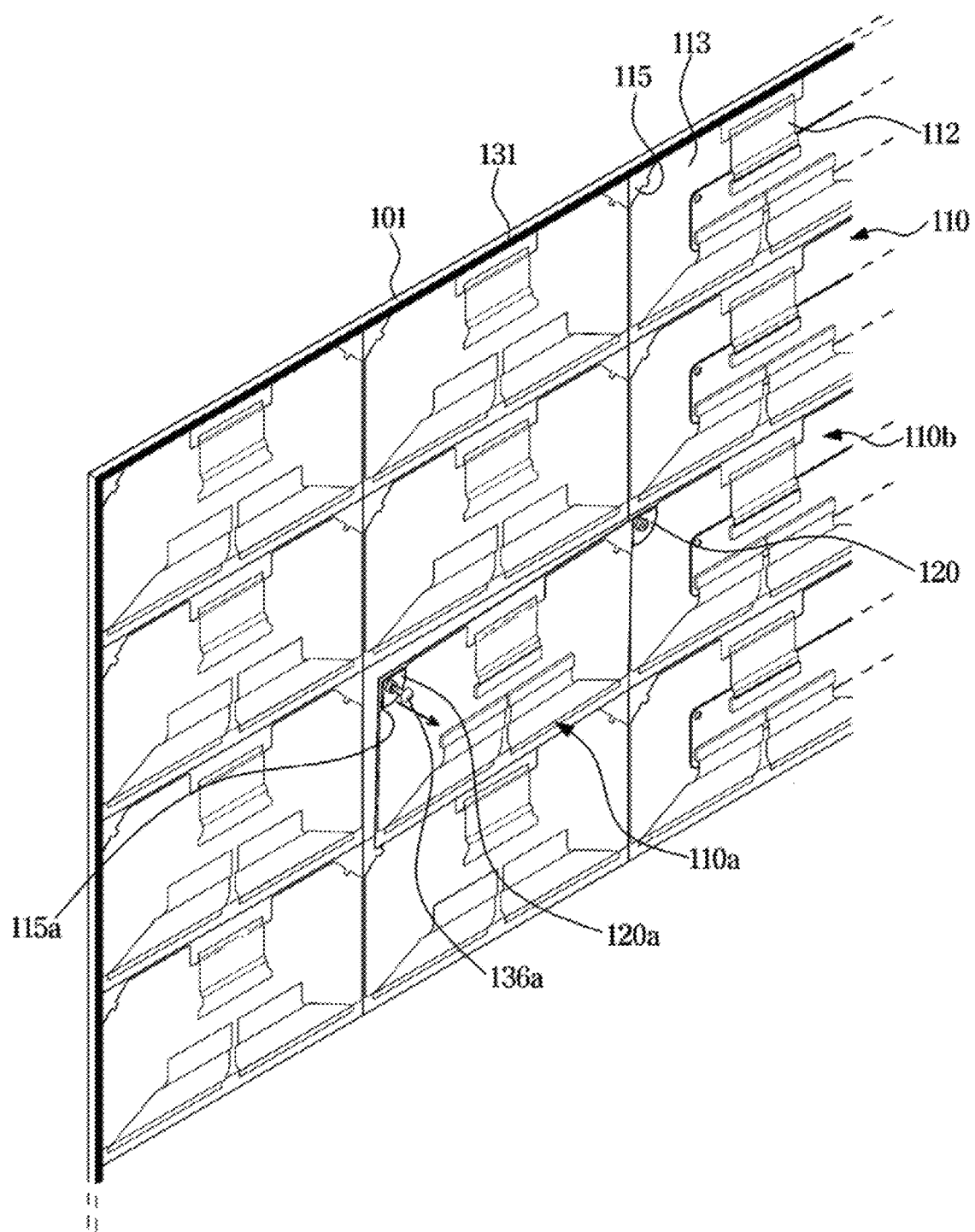
FIG. 10 is a third view for sequentially illustrating the process for replacing the one display module among the plurality of display modules of FIG. 2.

FIGS. 8 to 10 are views sequentially illustrating a process for replacing one display module among the plurality of display modules 110 of FIG. 2.

A process of separating a display module 110a from the plurality of display modules 110 will be described with reference to FIGS. 8 to 10. The display apparatus 1 according to an embodiment of the disclosure is configured to easily replace a display module 110a among the plurality of display modules 110 when the display module 110a needs to be replaced.

Particularly, referring to FIG. 8, when a defect occurs in the display module 110a among the plurality of display modules 110 and replacement is needed, an operator may first separate the rear cover 10 and the device board 30 of the display apparatus 1.

After separating the rear cover 10 from the frame 20 and separating the device board 30 connected to the panel boards 31, the operator may separate the fastening member 136 from the boss 120 to separate the frame 20 from the display panel 100. After separating the frame 20 from the display panel 100, the operator may separate the panel board (e.g. one of the panel boards 31) connected to the display module 110a that needs to be replaced. The operator may separate the module PCB 112 of the display modules 110 and the connection terminal 31aa of each connector 31a connected to the panel board.

Referring to FIG. 9, the operator may mount a boss 120a, for separation of the display module 110a, to a boss mounting portion 115a of the display module 110a that needs to be replaced. Not only when the operator intends to mount the display panel 100 to the frame 20, but also when the operator intends to separate the display module 110a from the plurality of display modules 110, the boss 120 and/or the boss 120a of the display apparatus 1 according to an embodiment of the disclosure may be mounted to the display module (e.g. display module 110a) that needs to be replaced. According to an embodiment, the boss 120a may have a same or similar configuration as the boss 120.

Particularly, when the display module 110a that needs to be replaced is a display module to which the boss 120 for coupling the display panel 100 to the frame 20 is not mounted, the operator may mount the boss 120a, for separation of the display module 110a, to the display module 110a that needs to be replaced. That is, the boss 120a may be mounted as an additional boss of the display panel 100.

On the other hand, when a display module 110b that needs to be replaced is a display module to which the boss 120 for coupling the display panel 100 to the frame 20 is already mounted, the operator may not need to couple the boss 120a, for separation of the display module 110b, to the display module 110b that needs to be replaced. That is, an additional boss may not be needed to be coupled to the display module 110b.

Referring to FIG. 10, the operator may couple a fastening member 136a, for separation, to the boss 120a mounted on the display module 110a that needs to be replaced. By applying a force to the fastening member 136a for separation, the operator can separate the display module 110a, which needs to be replaced, from the panel cover 101. The fastening member 136a for separation may be provided in the same manner as the fastening member 136 used for fixing the display panel 100 to the frame 20. In an embodiment, the fastening member 136a may have a same or similar structure as the fastening member 136. In an embodiment, the force applied to the fastening member 136a for separation may be a force applied in a rearward direction towards a rear of the display module 110a. For example, the force may cause the fastening member 136a to pull the display module 110a away from other display modules of the plurality of display modules 110 in the rearward direction. In an embodiment, the force may be applied to the fastening member 136a by a hand or a tool that pulls the fastening member 136a in the rearward direction.

In at least one of the display modules 110 (e.g. display module 110*a*) according to an embodiment of the disclosure, the boss mounting portion 115, to which the boss 120 or boss 120*a* is mounted, is formed at a corner portion, and accordingly, a force, which is to separate the display module 110*a* from the panel cover 101, is applied to the corner portion of the display module 110*a* that needs to be replaced. Therefore, by using a relative small amount of force, it is possible to separate the display module 110*a* that needs to be replaced. That is, the display module 110*a* that needs to be replaced may start to be separated from the corner portion thereof.

Although not shown, when the display module that needs to be replaced is the display module 110*b* to which the boss 120 is already mounted, the operator may re-couple the fastening member 136 to the boss 120 in a state in which the panel board (e.g. one of the panel boards 31) is separated from the display module 110*b*, and then the operator may separate the display module 110*b*, which needs to be replaced, from the panel cover 101 by applying the force to the fastening member 136 for separation. In an embodiment, the force applied to the fastening member 136 for separation may be a force applied in a rearward direction towards a rear of the display module 110*b*. For example, the force may cause the fastening member 136 to pull the display module 110*b* away from other display modules of the plurality of display modules 110 in the rearward direction. In an embodiment, the force may be applied to the fastening member 136 by a hand or a tool that pulls the fastening member 136 in the rearward direction.

As is apparent from the above description, because the plurality of display modules is attached to a single panel cover with the adhesive, a separate bezel for assembling and/or mounting the plurality of display modules may be omitted.

Because the plurality of display modules is attached to a single panel cover, thereby implementing the integration of the display panel, it is possible to minimize a step and/or a gap among the plurality of display modules.

Because the boss mounting portion is provided in the display module, it is possible to easily replace a single display module among the plurality of display modules.

As a single unit, the display module may be installed and applied to wearable devices, portable devices, handheld devices, and electronic products or electronic devices that need a display. Further, the plurality of display modules may be assembled in a matrix type and then applied to a display apparatus such as a PC monitor, a high definition TV, a digital signage, and an electronic display.

Although a few embodiments of the disclosure have been shown and described, it would be appreciated by those skilled in the art that changes may be made in these embodiments without departing from the principles and spirit of the disclosure.

What is claimed is:

1. A display apparatus comprising:
   a display panel comprising:
   a panel cover; and
   a plurality of display modules removably attached to the panel cover, a display module of the plurality of display modules comprising a substrate on which a plurality of inorganic light emitting diodes is mounted;
   a frame as a single body disposed to support the display panel, on which the plurality of display modules are installed and includes a board receiving portion recessed from a front surface of the frame;
   a rear cover configured to accommodate the display panel and the frame;
   at least one panel board arranged between the frame and the display panel and accommodated in the board receiving portion, and electrically connected to the plurality of display modules; and
   a device board arranged between the frame and the rear cover, and electrically connected to the at least one panel board through the board receiving portion;
   wherein the substrate comprises a mounting surface on which the plurality of inorganic light emitting diodes is mounted,
   wherein the display module of the plurality of display modules further comprises:
   a module plate attached to a surface opposite to the mounting surface of the substrate;
   a boss mounting portion, formed by the module plate, mounted on the substrate of the display module and positioned on the surface opposite to the mounting surface of the substrate; and
   a module Printed Circuit Board (PCB), electrically connected to the surface opposite to the mounting surface of the substrate,
   wherein the module plate comprises an edge that exposes the boss mounting portion, and the module plate is between the substrate and the module PCB, and
   wherein a thickness of a first part of the display module, in which the boss mounting portion is formed, is less than a thickness of a second part of the display module, in which the module plate is arranged.

2. The display apparatus of claim 1, further comprising:
   a double-sided tape extending along an edge of the display panel between the display panel and the frame.

3. The display apparatus of claim 1, wherein
   another display module from among the plurality of display modules comprises a substrate on which another plurality of inorganic light emitting diodes is mounted,
   wherein each of the display module and the another display module from among the plurality of display modules comprises a flexible printed circuit board (FPCB) electrically connected to the substrate of the respective display module, and
   wherein one or more of the at least one panel board is electrically connected to the FPCB of the display module and the FPCB of the another display module.

4. The display apparatus of claim 1, wherein
   the frame comprises:
   a frame body disposed to cover a rear of the display panel; and
   an edge cover disposed to cover an edge of the display panel.

5. The display apparatus of claim 1, wherein
   another display module of the plurality of display modules comprises a substrate on which another plurality of inorganic light emitting diodes is mounted, and
   wherein the module plate of the display module and a module plate of the another display module of the plurality of display modules are each configured to reinforce strength of the substrate of the respective display module.

6. The display apparatus of claim 1, wherein the panel cover comprises an optical film.

7. The display apparatus of claim 1, wherein an adhesive layer is provided between the panel cover and the plurality of display modules.

8. The display apparatus of claim 1, wherein the panel cover comprises glass.

9. The display apparatus of claim 1, wherein the module plate comprises aluminum.

\* \* \* \* \*